United States Patent [19]

Mitsuhashi et al.

[11] Patent Number: 5,303,374
[45] Date of Patent: Apr. 12, 1994

[54] APPARATUS FOR PROCESSING DIGITAL AUDIO SIGNAL

[75] Inventors: Satoshi Mitsuhashi, Tokyo; Masayuki Nishiguchi, Kanagawa, both of Japan

[73] Assignee: Sony Corporation, Tokyo, Japan

[21] Appl. No.: 776,213

[22] Filed: Oct. 15, 1991

[30] Foreign Application Priority Data

Oct. 15, 1990 [JP] Japan ................... 2-273286

[51] Int. Cl.⁵ .............................................. G10L 9/14
[52] U.S. Cl. ................................................ 395/2.21
[58] Field of Search ................... 381/29, 36, 37, 47, 381/51; 375/27, 26, 33, 34

[56] References Cited

U.S. PATENT DOCUMENTS

| | | | |
|---|---|---|---|
| 2,605,361 | 7/1952 | Cutler | 375/33 |
| 2,724,740 | 11/1955 | Cutler | 375/33 |
| 4,685,115 | 8/1987 | Akagiri | 375/25 |
| 4,783,792 | 11/1988 | Akagiri et al. | 375/27 |
| 4,797,902 | 1/1989 | Nishiguchi et al. | 375/34 |

FOREIGN PATENT DOCUMENTS 0207171 1/1987 European Pat. Off. .
0331405 9/1989 European Pat. Off. .

*Primary Examiner*—Allen R. Macdonald
*Assistant Examiner*—Richard J. Kim
*Attorney, Agent, or Firm*—Hill, Steadman & Simpson

[57] ABSTRACT

A digital audio signal processing apparatus is provided having a predictive error generator for generating predictive error data by processing input digital data to acquire a plurality of different frequency characteristics. A selector selects one of the plural predictive error data. A requantizer requantizes the selected predictive error data. A corrector processes with a predetermined frequency characteristic, the requantization error induced during the operation of the requantizer, thereby correcting the requantization error caused in the requantizer. A frequency characteristic control selects at least two of the predictive error data obtained with the plural frequency characteristics, then calculates the selected predictive error data and controls the frequency characteristic in the corrector in accordance with the result of such calculation. In this apparatus, the ratio or the difference between at least two predictive error data obtained with a plurality of frequency characteristics is calculated and then is compared with a predetermined reference value. The frequency characteristic in the corrector is controlled in conformity with the numerical relation between the calculated value and the reference value. Therefore, two or more frequency characteristics in the corrector are selectively rendered conformable with one frequency characteristic in the predictive error generator, hence achieving an enhanced effect of further improving the signal-to-noise ratio.

4 Claims, 3 Drawing Sheets

APPARATUS FOR PROCESSING DIGITAL AUDIO SIGNAL

BACKGROUND OF THE INVENTION

1. Field of the Invention

The present invention relates to an apparatus for processing a digital audio signal and, more particularly, to an apparatus adapted for use in recording, reproducing and transmitting an audio signal or the like with a high quality.

2. Description of the Prior Art

There is proposed a method of compressing digital audio data by the use of a technique termed adaptive predictive coding (APC). Such method is capable of recording audio data at a high density without deteriorating the signal-to-noise ratio or articulation thereof. And, a conventional signal processing apparatus contrived to perform such a recording operation is disclosed in, for example, U.S. Pat. No. 4,797,902 or U.S. Pat. No. 5,070,515 by the present applicant.

The apparatus cited above fundamentally comprises a predictive error generating circuit for dividing input digital data into blocks each composed of a predetermined number of words along the time base, then processing the data of each block to acquire a plurality of different frequency characteristics, and generating predictive error data thereof; a selecting circuit for selecting, out of such predictive error data obtained from the predictive error generating circuit, the data having the smallest one of maximum absolute values; a bit compressing circuit for compressing the bits of the selected predictive error data; a correcting circuit for processing the quantization error caused at the time of bit compression with predetermined frequency characteristics and feeding the processed error back to the bit compressing circuit; and a frequency characteristic control circuit for controlling the frequency characteristic of the correcting circuit in such a manner as to conform the same with the frequency characteristic optimal for obtaining the predictive error data having the smallest one of the maximum absolute values at the respective frequency characteristics.

For example, one block is composed of 28 words each consisting of 16-bit input audio digital data. The data in each block are processed with four different frequency characteristics, and the maximum predictive errors (absolute values) obtained by the processes with the respective characteristics are detected. And, the frequency characteristic relative to generation of the smallest value out of such four maximum predictive errors is selected as a characteristic for optimizing the signal-to-noise ratio.

The bits of the predictive error data produced as a result of the process with such selected frequency characteristic are compressed (requantized) by selection of, for example, 4 significant bits out of 16 bits. The requantization error resulting from the bit compression is processed with the same frequency characteristic as that used in the predictive error generating circuit and then is fed back to the bit compressing circuit, whereby the spectrum of the requantization noise is turned into white noise differently from the spectrum of the input audio data.

By adjusting the frequency characteristic of the requantization error thus fed back, it is rendered possible to distribute much of the requantization noise in a frequency band where the energy level of the audio data is high, so that the signal-to-requantization noise ratio (SNR) can be improved by the auditory masking effect.

The process of improving the auditory SNR by shaping the spectrum of the requantization noise in a manner to conform with the spectrum of the input audio data is the fundamental principle of the cited known apparatus. In strictly optimizing the relationship of mutual correspondence between the two spectra, precise analysis of the input signal becomes necessary to consequently require a huge amount of calculations and complicated noise shaping.

Therefore, the conventional apparatus is so contrived that, under an assumed condition where the frequency characteristic in the process of generating a predictive error corresponds substantially to the spectrum of the input signal, the frequency characteristic of the requantization error correcting circuit is set to have a relationship of 1:1 to the frequency characteristic of the predictive error generating circuit.

In such a constitution, however, there arises a problem that when the input audio signal is an intense attack sound of a piano or the like, the signal-to-noise ratio may be deteriorated on the contrary to consequently cause a noise.

OBJECT AND SUMMARY OF THE INVENTION

The present invention has been accomplished in view of the circumstances mentioned. And, it is an object of the invention to provide a digital audio signal processing apparatus which is capable of ensuring an improved satisfactory signal-to-noise ratio without complicating the constitution thereof.

According to one aspect of the present invention, there is provided a digital audio signal processing apparatus comprising a predictive error generator means for generating predictive error data by processing input digital data to acquire a plurality of different frequency characteristics; a selector means for selecting one of the plural predictive error data; a requantizer means for requantizing the selected predictive error data; a corrector means for processing, with a predetermined frequency characteristic, the requantization error induced during the operation of the requantizer means, thereby correcting the requantization error caused in the requantizer means; and a frequency characteristic control means for selecting at least two of the predictive error data obtained with the plural frequency characteristics, then calculating the selected predictive error data and controlling the frequency characteristic in the corrector means in accordance with the result of such calculation.

In the digital audio signal processing apparatus of the constitution mentioned, the ratio or the difference between at least two predictive error data obtained with a plurality of frequency characteristics is calculated and then is compared with a predetermined reference value. And, the frequency characteristic in the corrector means is controlled in conformity with the numerical relation between the calculated value and the reference value.

Therefore, two o more frequency characteristics in the corrector means are selectively rendered conformable with one frequency characteristic in the predictive error generator means, hence achieving an enhanced effect of further improving the signal-to-noise ratio.

The above and other features and advantages of the present invention will become apparent from the following description which will be given with reference to the illustrative accompanying drawings.

DESCRIPTION OF THE PREFERRED EMBODIMENT

Hereinafter the digital audio signal proceing apparatus of the present invention will be described in detail with reference to an exemplary embodiment thereof shown in the accompanying drawings.

Figure 1:
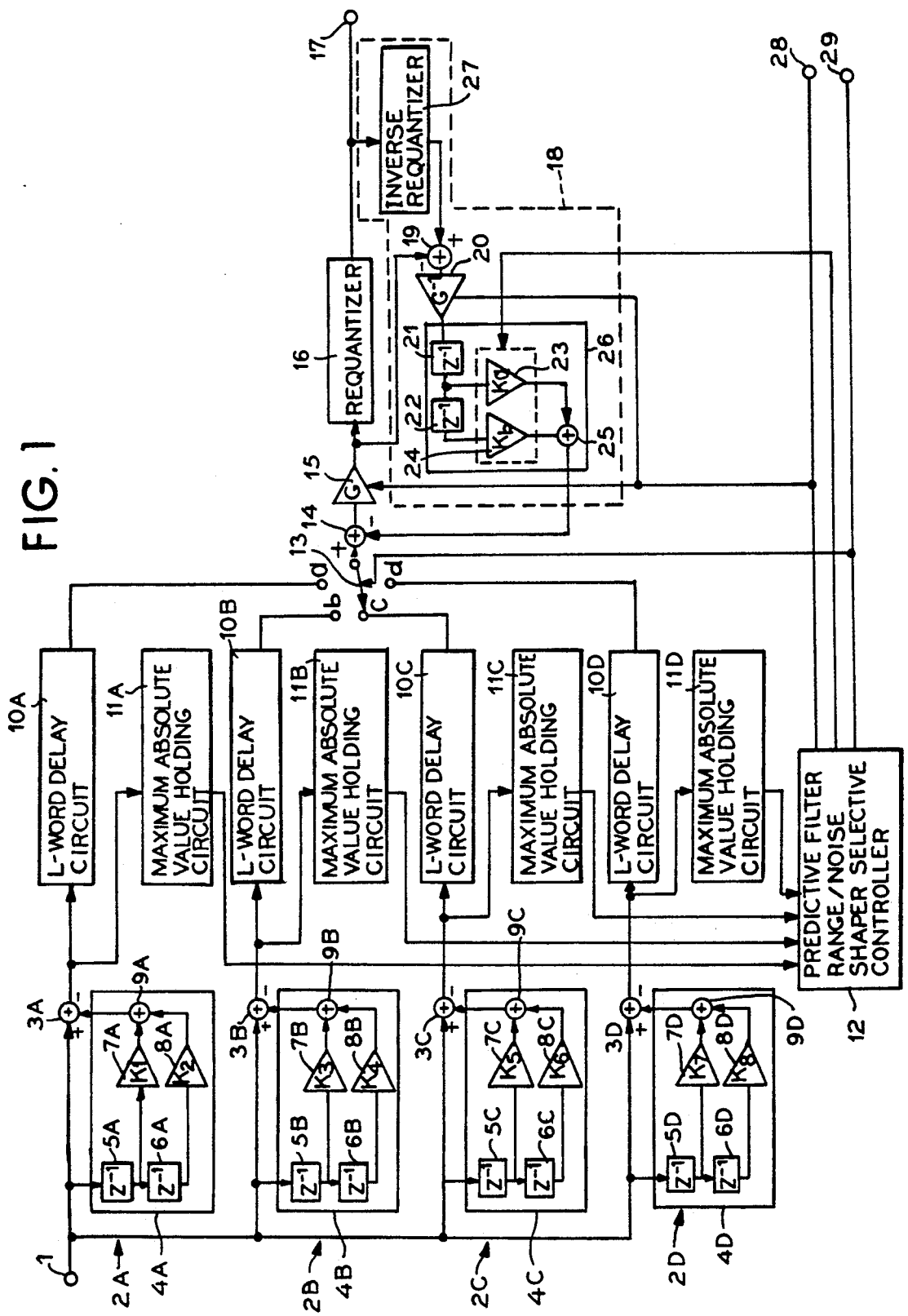
FIG. 1 is a block diagram of a digital audio signal processing apparatus embodying the present invention.

FIG. 1 is a block diagram showing the constitution of such digital audio signal processing apparatus according to the invention.

In this embodiment, digital audio data converted by an unshown A-D (analog-to-digital) converter is supplied to an input terminal 1. The digital audio data thus received via the input terminal 1 is then supplied to four differential processing circuits 2A-2D.

The differential processing circuit 2A comprises an adder 3A and a predictive filter 4A for processing the input digital data with a predetermined frequency characteristic. The adder 3A adds the output of the predictive filter 4A to the input digital data in an inverse polarity (to execute a subtraction). The predictive filter 4A comprises a delay circuit 5A for delaying the input data by one sample; a delay circuit 6A for delaying the output of the delay circuit 5A by another sample; multipliers 7A, 8A for multiplying the outputs of the delay circuits 5A, 6A by a predetermined coefficient K1 or K2; and an adder 9A for adding the outputs of the multipliers 7A and 8A to each other and supplying the result of such addition to the adder 3A.

Similarly to the differential processing circuit 2A mentioned above, the differential processing circuits 2B, 2C, 2D comprise adders 3B, 3C, 3D and predictive filters 4B, 4C, 4D, respectively.

Similarly to the predictive filter 4A mentioned above, the other predictive filters 4B, 4C, 4D comprise delay circuits 5B, 6B, 5C, 6C, 5D, 6D, multipliers 7B, 8B, 7C, 8C, 7D, 8D for multiplying coefficients K3-K8, and adders 9B, 9C, 9D, respectively.

The coefficients K1-K8 of the multipliers 7A-8D are set as follows under exemplary conditions where the sampling frequency $f_s$ for an audio PCM signal is 18.9 kHz, 1 word (1 sample) is composed of 16 bits, and 1 block is composed of 28 words.

K1 = 1.8426
K2 = −0.8649
K3 = 0.875
K4 = 0
K5 = 1.5155
K6 = −0.81
K7 = 0
K8 = 0

As a result of such setting, the transmission functions of the differential processing circuits 2A-2D are determined as follows.

2A: $1 - 1.8426z^{-1} + 0.8649z^{-1}$
2B: $1 - 0.875z^{-1}$
2C: $1 - 1.5155z^{-1} + 0.81z^{-2}$
2D: $1$

Figure 2:
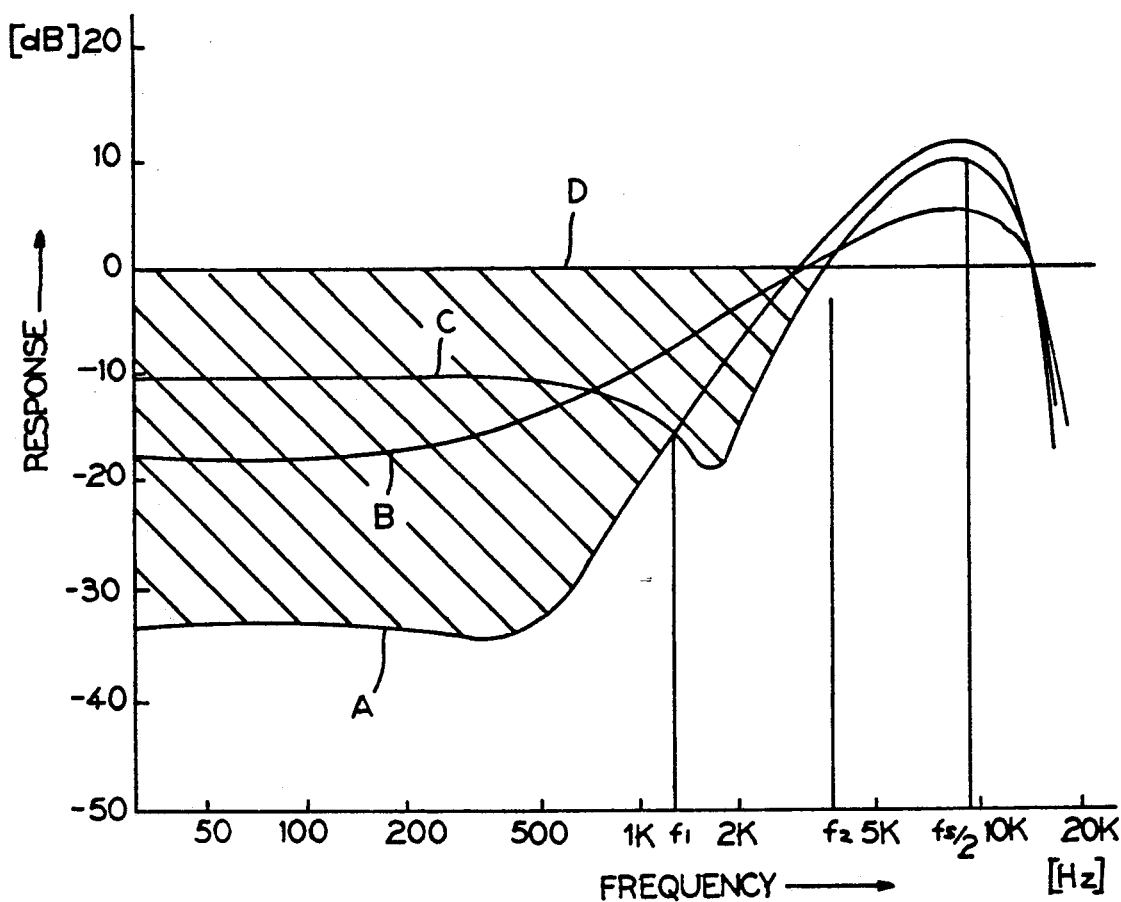
FIG. 2 graphically shows the characteristics of differential processing circuits employed in the apparatus of FIG. 1.

The frequency characteristics relative to such transmission functions of the differential processing circuits 2A-2D are graphically represented by curves A-D in FIG. 2, respectively.

The outputs of the differential processing circuits 2A-2D are supplied respectively to maximum absolute value holding circuits 11A-11D corresponding thereto. Each of the maximum absolute value holding circuits 11A-11D detects and holds one predictive error data, which has the maximum absolute value, out of the input data of 1 block composed of L (=28) words. And, the data of the maximum absolute values are supplied to a predictive filter range/noise shaper selective controller 2.

Meanwhile, the outputs of the differential processing circuits 2A-2D are supplied also to contacts a-d of a switch 13 after being delayed by L-word delay circuits 10A-10D for a time required to detect the maximum absolute values out of 1 block data, i.e., for a time corresponding to 1 block (L words).

The controller 12 selects the smallest one of the maximum absolute values output from the maximum absolute value holding circuits 11A-11D, and then feeds to the switch 13 the mode selection data corresponding to the selected value, thereby actuating the switch 13 in a manner to select the predictive error data having the smallest maximum absolute value. The controller 12 serves to calculate the ratio or difference of the four maximum absolute values and compares the result of such calculation with a predetermined reference value. The controller 12 further controls the coefficients Ka and Kb of the multipliers 23, 24 in the corrector 18 in a manner that the coefficient corresponding to the result of the above comparison is set.

The controller 12 has another function of producing shift control data in conformity with the smallest maximum absolute value and feeds the control data to shifters 14 and 20.

The predictive error data output from the switch 13 is supplied via the adder 14 to the shifter 15 where a predetermined bit shift is executed, and thereafter the error data is supplied to a requantizer 16. Then the requantizer 16 extracts the data of predetermined bits and feeds the extracted data to an output terminal 17.

The input to the requantizer 16 is supplied directly to an adder 19 while the output from the requantizer 16 is supplied via an inverse requantizer 27 to the adder 19, whereby the difference (requantization error) therebetween is detected. The requantization error is fed back to the adder 14 via the shifter 20 and a noise filter 26 in the corrector 18. Similarly to the predictive filters 4A-4D, the noise filter 26 comprises delay circuits 21, 22, multipliers 23, 24 and an adder 25.

All of the requantized data output from the requantizer 16 via the output terminal 17, shift control data output from the controller 12 via the output terminals 28, 29, and mode selection data are transmitted through an unshown transmission path and are recorded on an unshown recording medium, such as a compact disc.

In this embodiment, the differential processing circuits 2A-2D serve as predictive error generator means;

the L-word delay circuits 10A-10D, the maximum absolute value holding circuits 11A-11D and the switch 13 serve as selector means; the shifter 15 and the requantizer 16 serve as requantizer means; the controller 12 serves as frequency characteristic control means; and the corrector 18 serves as corrector means, respectively.

Figure 3:
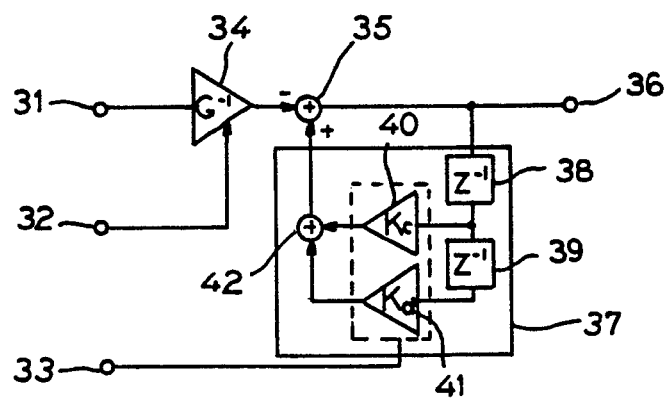
FIG. 3 is a block diagram of an exemplary decoder for decoding the output of the embodiment shown in FIG. 1.

FIG. 3 shows the constitution of an exemplary decoding system in an apparatus to process the data transmitted thereto.

The data received from the output terminals 17, 28, 29 in FIG. 1 are fed to input terminals 31, 32, 33, respectively. The requantized data fed to the input terminal 31 is supplied to a shifter 34 where a predetermined bit shift is executed, and then the data is delivered from an output terminal 36 via an adder 35. The output of the adder 35 is processed by a predictive filter 37 and then is supplied to one input terminal of the adder 35. Similarly to any of the aforementioned predictive filters 4A-4D, the predictive filter 37 comprises delay circuits 38, 39, multipliers 40, 41 for multiplying coefficients Kc and Kd, and an adder 42. The shift amount of the shifter 34 is controlled in conformity with the shift control data obtained from the input terminal 32, and the coefficients Kc, Kd of the multipliers 40, 41 are controlled in conformity with the mode selection data obtained from the input terminal 33.

Now the above operation will be described in detail below.

The data received via the input terminal 1 are supplied to the differential processing circuits 2A-2D and are processed individually per word (16 bits). More specifically, the predictive filter 4A adds the data, which is obtained through multiplication of the 1-word delayed input data (1-word preceding data) by the coefficient K1, to the data obtained through multiplication of the 2-word delayed data (2-word preceding data) by the coefficient K2. The data produced by weighting the immediately preceding 2 words of the present one by the coefficients K1 and K2 and adding them to each other can be regarded as the data that predicts the present word from the preceding 2 words. The adder 3A outputs the difference (predictive error) between the present word and the predictive word acquired by such addition of the data. Since the coefficients K1 and K2 are set to the aforementioned values, the predictive error data is supposed to have the frequency characteristic represented by a curve A in FIG. 2 in case the input data has a flat frequency characteristic.

The predictive error data thus obtained is supplied to the maximum absolute value holding circuit 11A and is held therein. Such operation is repeated with respect to each word and, in response to every new predictive error data, the maximum absolute value holding circuit 11A compares the same with the preceding value being held therein. And, when the absolute value of the preceding data being held is greater, it is held continuously without any replacement. However, if the absolute value of the new data is greater, such new data is held in place of the preceding one. Since this operation is performed with respect to 1 block (28 words), the predictive error data having the maximum absolute value of the relevant block is held in the maximum absolute value holding circuit 11A.

After completion of processing the entire 28 words (1 block), the data of 1 block are supplied to the contact a of the switch 13 via the delay circuit 10A upon determination of the predictive error data having the maximum absolute value in such block.

The same process as the above is executed in each of the differential processing circuits 2B, 2C, 2D, whereby predictive error data output from the differential processing circuits 2A-2D are supplied to the contacts a-d of the switch 13, respectively. The switch 13 is changed in accordance with the mode selection data output from the controller 12 and selects one predictive error data (optimal predictive error data) having the smallest maximum absolute value.

More specifically, as graphically shown in FIG. 2, the differential processing circuit 2A serves as a filter corresponding to a secondary differential PCM mode 1 (curve A), the differential processing circuit 2B as a filter corresponding to a primary differential PCM mode (curve B), the differential processing circuit 2C as a filter corresponding to a secondary differential PCM mode 2 (curve C), and the differential processing circuit 2D as a filter corresponding to a straight PCM mode (curve D), respectively. In the secondary differential PCM mode 1 (curve A), the prediction gain in a relatively low frequency range is so determined as to increase the improvement of the signal-to-noise ratio. Also in the primary differential PCM mode (curve B), the signal-to-noise ratio is improved in a low frequency range as in the secondary differential PCM mode (curve A), but the amount of improvement is set to be smaller than that in the curve A. Meanwhile in the secondary differential PCM mode 2 (curve C), the gain is so determined as to increase the improvement of the signal-to-noise ratio in a medium frequency range. And, in the straight PCM mode (curve D), there is given none of frequency characteristics.

Assuming now that data of a single sine-wave signal is input and its frequency is within a range from 0 to f1 (frequency at an intersection of the curves A and C), the characteristic curve A (differential processing circuit 2A) is selected. In case the frequency is within a range from f1 to f2 (frequency at an intersection of the curves C and D), the characteristic curve C (differential processing circuit 2C) is selected. And, the characteristic curve D (differential processing circuit 2D) is selected when the frequency is within a range from f2 to $f_s/2$. Due to such selection, a satisfactory result can be achieved in improving the signal-to-noise ratio. The data of any frequency above $f_s/2$ is rejected through a low pass filter (not shown) prior to analog-to-digital conversion so as to prevent aliasing.

Practically, however, any actual audio data is not composed of a single sine-wave signal, so that the above-described selections with such exact borders are not performed, and the characteristic curve B (differential processing filter 2B) is also selected relatively frequently.

The 16-bit maximum predictive error data selected by the switch 13 is supplied to the shifter 15 where a predetermined bit shift is executed. In case each word is represented by a 2's complement for example, its MSB (most significant bit) indicates the polarity in such a manner that 0 and 1 denote positive and negative, respectively. If the word having the maximum absolute value of the MSB (16th bit) through the 13th bit are 0 while the 12th bit through the LSB (least significant bit) are 1 or 0, then the 13th bit is left to indicate the polarity, and 4 bits from the 13th through the 10th are used as effective bits. Therefore, the amount of bit shift in the shifter 15 for each word of this block is determined to be 3 bits. (This amount of shift is kept constant in one block.) Consequently the word shown in FIG. 4A is so processed by the shifter 15 that a shift of 3 bits is executed toward the MSB as shown in FIG. 4B.

The requantizer 16 separates the high-order 4 bits (0101 in FIG. 4B) thus shifted and transmits 4-bit data from the output terminal 17. Due to the process mentioned, the 16-bit data (word) shown in FIG. 4A is compressed to 4-bit data (word).

Figure 4:
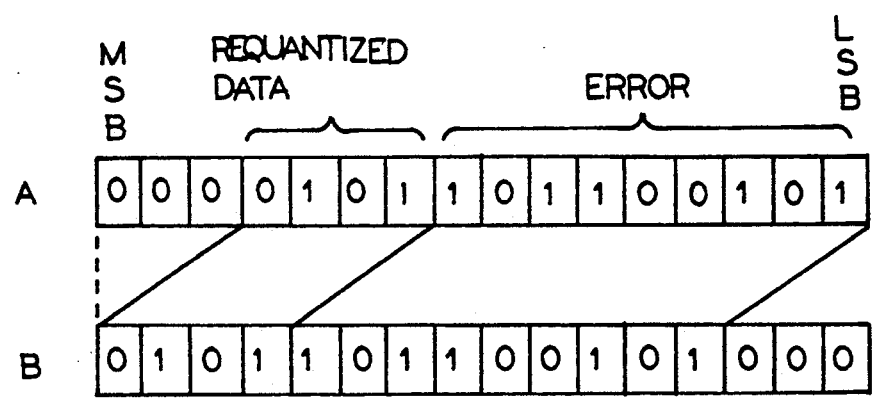
FIG. 4 is a schematic diagram for explaining an operation of bit compression performed in the embodiment of FIG. 1.

As a result of compressing the 16-bit data to 4-bit data in the above-described procedure, the data (101100101) from the LSB through the 9th bit shown in FIG. 4A is cut to become a requantization error. The adder 19 detects such requantization error from the difference between the input and the output of the requantizer 16. More specifically, the 4-bit requantized data (0101) is inversely requantized in the inverse requantizer 27 to 16-bit data (0101000000000000). And the requantization error (0000101100101000) is calculated from the difference between the above 16-bit data and the data (0101101100101000) of FIG. 4B.

The requantization error data thus obtained is inputted to the shifter 20 where a 3-bit shift is executed toward the LSB, thereby producing data (0000000101100101). This 16-bit requantization error data is then input to the noise filter 26.

The requantization error processed to have a predetermined characteristic in the noise filter 26 is then fed back to the optimal predictive error data via the adder 14.

In the conventional apparatus, the coefficients Ka, Kb of the multipliers 23, 24 in the noise filter 26 are set to the same values as those of the coefficients $K_i$, $K_{i+1}$ (where i=1, 3, 5, 7) of the predictive filters in the differential processing circuits which generate optimal predictive errors, or to a predetermined value in place of the above same values. In this embodiment, however, the coefficients Ka, Kb are set to one of a plurality of values as shown in the table below.

In the table, J1, J2, J3 denote numerical values between 0 and 1, and are determined experimentally by an auditory test or the like.

Also in the table, Am, Bm, Cm, Dm denote the smallest maximum absolute values of the predictive error data output from the differential processing circuits 2A, 2B, 2C, 2D, respectively.

TABLE

| I | II | III | IV |
|---|---|---|---|
| 4A (Am) | Low range (concentrated on lower range) | Am/Dm < J1 | Low-range |
|  |  | Am/Dm ≧ J1 | Flat |
| 4B (Bm) | Low range (widely distributed) | None | Flat |
| 4C (Cm) | High range (near 3 kHz) | Cm/Am < J2 | High-range |
|  |  | Cm/Am ≧ J2 | Flat |
| 4D (Dm) | High range | Dm/Am < J3 | High-range |
|  |  | Dm/Am ≧ J3 | Flat |

I: Selected predictive filter (Smallest maximum absolute value)
II: Presumed input signal distribution
III: Maximum absolute value of relevant predictive filter
IV: Noise shaping to be executed When the smallest maximum absolute value is Am, the selected predictive filter is 2A (characteristic curve A in FIG. 2). Therefore the spectrum of the audio data is presumed to be concentrated fundamentally on a lower range. However, when the ratio Am/Dm is greater than the reference value J1 (when the difference between Am and Dm is small), it is considered that a relatively high range component is also existent in the input signal. Then, the coefficients Ka, Kb of the multipliers 23, 24 in the noise filter 26 are set to be equal to the coefficients K1, K2 of the multipliers 7A, 8A in the predictive filter 4A so as to attain a uniform distribution of the requantization noise, whereby flat noise shaping is executed.

In this manner, only when the ratio Am/Dm is smaller than the reference value J1, the coefficients Ka, Kb for execution of low-range noise shaping are set to achieve a low-range emphasized distribution of the requantization error.

It follows that greater-energy requantization noise is distributed in a frequency range where the energy level of the signal is higher. As a result, the auditory signal-to-noise ratio can be improved.

Similarly to the above, when the smallest maximum value is Cm, the spectrum of the audio data is presumed to be distributed in a high range (near 3 kHz). However, when the ratio Cm/Am is greater than the reference value J2, it is considered that some energy is distributed in a low range as well, and, therefore, the coefficients Ka, Kb are set to be equal to the coefficients K5, K6 so as to attain a flat frequency characteristic. And, when the ratio Cm/Am is smaller than the reference value J2, the coefficients Ka, Kb are so set as to attain a high-range characteristic.

Also in case the smallest maximum absolute value is Dm, the spectrum of the audio data is presumed to be distributed in a relatively high range, but if the ratio Dm/Am is greater than the reference value J3, it is considered that some energy is distributed in a low range as well. Therefore the coefficients Ka, Kb are set to be equal to the coefficients K7, K8 so as to attain a flat frequency characteristic. Meanwhile, if the ratio Dm/Am is smaller than the reference value J3, the coefficients Ka, Kb are so set as to attain a high-range characteristic.

When the smallest maximum absolute value is Bm, the spectrum of the audio data is distributed in a low range with certainty, and such distribution is presumed to be relatively wide. Therefore, the coefficients Ka, Kb are set to be equal to the coefficients K3, K4 so as to attain a flat frequency characteristic.

In case the input audio signal is an intense attack sound of a piano or the like as mentioned previously, the principal components reside mostly in a low range, but much of the harmonic components is existent in a high range as well. In the prior art, it is occasionally caused that, when such signal is input, the predictive filter 4C or 4D is selected erroneously due to harmful influence of the harmonic components. And, if high-range up noise shaping is executed in such a case, harmful influence of the low-range principal component is rendered noticeable to consequently deteriorate the auditory signal-to-noise ratio in comparison with execution of flat noise shaping. In the present invention, when the ratio Cm/Am or Dm/Am is relatively great, flat noise shaping is executed regardless of whether the predictive filter 4C or 4D is selected, i.e., if the smallest maximum absolute value is Cm or Dm, hence preventing deterioration of the signal-to-noise ratio.

The coefficients Ka, Kb are altered gradually to avert any significant characteristic change.

Now, the operation of the decoder shown in FIG. 3 will be described in detail below.

The 4-bit requantized data received from the input terminal 31 is restored to the former 16-bit data by the shifter 34. The positions of the transmitted 4 bits in such 16 bits are determined in accordance with the shift control data obtained from the input terminal 32. The output of the shifter 34 is supplied to the adder 35 to be added to the output of the predictive filter 37 in an inverse polarity (actually to be subtracted therefrom) and then is transmitted from the output terminal 36. The data thus obtained from the output terminal 36 is supplied also to the predictive filter 37, where the input data is delayed in the delay circuits 38 and 39 by one word, respectively. The 1-word delayed data from the circuit 38 is multiplied by the coefficient Kc in the multiplier 40, and the 2-word delayed data from the circuit 39 is multiplied by the coefficient Kd in the multiplier 41. The outputs of the multipliers 40 and 41 are added to each other in the adder 42 and then are supplied to the adder 35. And, in response to the mode selection data from the input terminal 33, the coefficients Kc, Kd of the multipliers 40, 41 are set to be equal to the coefficients $K_{2i-1}$, $K_{2i}$ where $i = 1, 2, \ldots 4$ of the multipliers of the predictive filter in the differential processing circuit which has output the optimal predictive error, whereby a process inverse to the aforementioned one in the differential processing circuits 2A-2D is executed to regain the former characteristic data.

Although the four differential processing circuits 2A-2D are arranged independently of one another in the embodiment illustrated in FIG. 1, a single processing circuit may be employed instead and operated under time sharing control.

In the embodiment mentioned, two of the maximum absolute values of the differential processing circuits 2A-2D are selected, and the frequency characteristic of the noise filter 26 is controlled in accordance with the ratio of the selected values. However, such control may be performed in accordance with the difference between the two maximum absolute values. In another modification, three or more maximum absolute values may be selected, and the frequency characteristic may be controlled in accordance with the result of calculating the selected values.

The embodiment mentioned above represents merely an exemplary case of applying the present invention to a digital audio signal processing apparatus equipped with a straight PCM mode, a primary differential PCM mode and a secondary differential PCM mode. However, it is to be understood that the present invention is not limited to such example alone and is applicable also to other digital signal processing devices which employ adaptive predictive coding or the like.

As described hereinabove, according to the present invention where the frequency characteristic of a corrector means is controlled in accordance with the result of calculating at least two predictive error data, it becomes possible to realize more exact noise shaping to thereby improve the auditory signal-to-noise ratio without any complication of the constitution.

What is claimed is:

1. An apparatus for processing a digital audio signal, comprising:
    predictive error generator means for generating predictive error data by processing input digital data to acquire a plurality of different frequency characteristics;
    selector means for selecting a predetermined one of said plurality of predictive error data;
    requantizer means for requantizing the predictive error data selected by said selector means;
    corrector means for processing, with a predetermined frequency characteristic, the requantization error data induced during operation of said requantizer means, and correcting the requantization error data executed by said requantizer means;
    frequency characteristic control means for selecting at least two or said predictive error data obtained with said frequency characteristics, then calculating the selected predictive error data and controlling the frequency characteristic in said corrector means in accordance with a result of the calculation wherein the calculation of said two selected predictive error data is executed by computing a ratio of respective absolute values of said predictive error data and comparing said ratio with a reference value; and the frequency characteristic in said corrector means is controlled in accordance with a result of the comparison.

2. The apparatus according to claim 1, wherein said predictive error generator means processes the input digital data to acquire four kinds of mutually different frequency characteristics conforming with presumed frequency component distributions of the input digital data in such a manner that, when the presumed frequency component distribution is concentrated on a lower frequency range, there is calculated, with respect to the predictive error data selected by said selector means, a ratio of the maximum absolute value of an output of a predictive filter relative to the input digital data where the presumed frequency component distribution thereof is concentrated on a lower range, to a maximum absolute value of an output of the predictive filter relative to the input signal where the presumed frequency component distribution thereof is concentrated on a high range, and a ratio thus calculated is compared with a reference value so that low-range or noise shaping is executed selectively.

3. The apparatus according to claim 1, wherein said predictive error generator means processes the input digital data to acquire four kinds of mutually different frequency characteristics conforming with frequency component distributions of the input digital data such that, when a presumed frequency component distribution of the input digital data is concentrated on a high frequency range, there is calculated, with respect to the predictive error data selected by said selector to the predictive error data selected by said selector means, a ratio of a maximum absolute value of an output of a predictive filter relative to the input digital data where the presumed frequency component distribution thereof is concentrated on a lower range, to a maximum absolute value of an output of the predictive filter relative to the input digital data where the presumed frequency component distribution thereof is concentrated on a high range, and a ratio thus calculated is compared with a reference value so that high-range or noise shaping is executed selectively.

4. The apparatus according to claim 1, wherein said predictive error generator means processes the input digital data to acquire four kinds of mutually different frequency characteristics in conformity with an input signal distribution, and when presumed frequency components of the input digital data are distributed in a low range, noise shaping is executed.

* * * * *